(12) United States Patent
Maraschin

(10) Patent No.: US 6,200,415 B1
(45) Date of Patent: Mar. 13, 2001

(54) LOAD CONTROLLED RAPID ASSEMBLY CLAMP RING

(75) Inventor: Robert A. Maraschin, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/343,931

(22) Filed: Jun. 30, 1999

(51) Int. Cl.⁷ .............................. C23F 1/02; C23C 16/00
(52) U.S. Cl. ........................................... 156/345; 118/715
(58) Field of Search ............................. 156/345; 118/715

(56) References Cited

U.S. PATENT DOCUMENTS

| | | | |
|---|---|---|---|
| 3,645,460 | * | 2/1972 | Scaffidi ................................. 241/299 |
| 3,736,394 | * | 5/1973 | Rumbaugh ............................ 200/158 |
| 3,881,392 | * | 5/1975 | Curtis ........................................ 85/62 |
| 4,302,136 | * | 11/1981 | Abe et al. ............................. 411/158 |
| 4,636,120 | * | 1/1987 | Brandsberg et al. ................... 411/14 |
| 4,995,340 | * | 2/1991 | Martlew et al. ...................... 118/715 |
| 5,290,010 | * | 3/1994 | Ridge .................................... 251/214 |
| 5,316,278 | | 5/1994 | Sherstinsky et al. ................. 269/254 |
| 5,374,136 | * | 12/1994 | Laplante ............................... 403/370 |
| 5,456,757 | * | 10/1995 | Aruga et al. ....................... 118/723 E |
| 5,712,746 | | 1/1998 | Moir et al. ......................... 360/98.08 |
| 5,810,933 | * | 9/1998 | Mountsier et al. ................... 118/724 |
| 5,829,933 | * | 11/1998 | Kramer ................................. 411/156 |
| 5,868,847 | | 2/1999 | Chen et al. .......................... 118/715 |
| 5,913,647 | * | 6/1999 | Hodge ..................................... 411/11 |
| 5,940,273 | * | 8/1999 | Fishman et al. ...................... 361/704 |

* cited by examiner

Primary Examiner—Jeffrie R. Lund
(74) Attorney, Agent, or Firm—Oppenheimer Wolff & Donnelly, LLP

(57) ABSTRACT

Disclosed are inventive apparatuses and methods for interfacing ceramic and metal plasma reaction chamber components. The apparatuses include a clamp ring having a unitary plate having a plurality of attachment pad regions. The attachment pad regions are connected together with connecting regions which are relatively more deformable to thermal stresses than are the attachment pad regions. The clamp ring is attached to the ceramic plasma chamber utilizing a plurality of bolt tensioning assemblies having spring washers and indicator washers configured such that the correct torque value can be applied without the need of a torque wrench or other such tool.

29 Claims, 7 Drawing Sheets

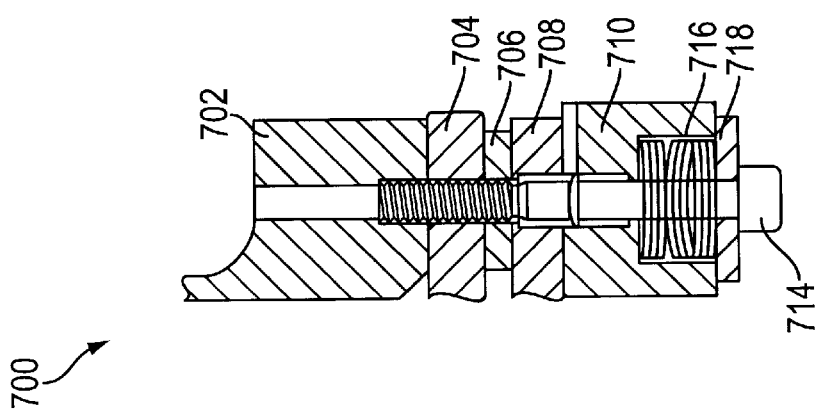
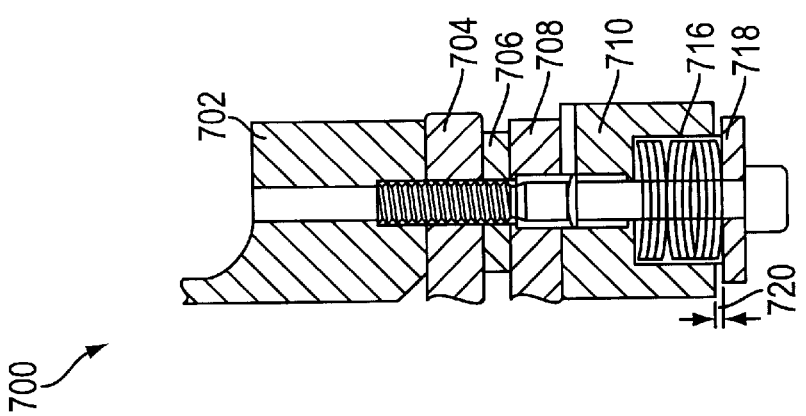
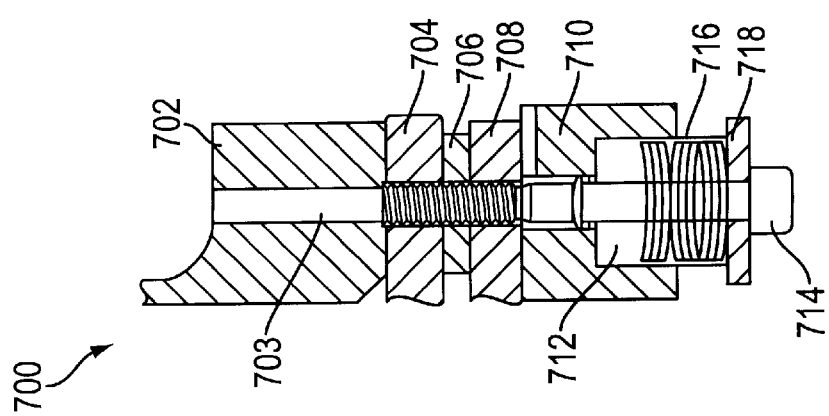

LOAD CONTROLLED RAPID ASSEMBLY CLAMP RING

BACKGROUND OF THE INVENTION

The present invention relates to plasma reactors for the fabrication of integrated circuits (IC's). More particularly, the present invention relates to methods and apparatus for coupling ceramic and metallic reactor parts of plasma reactors to reduce damage caused by thermal expansion.

In semiconductor IC fabrication, plasma etch chambers used for IC fabrication were often designed from metallic materials, such as aluminum. These metal etch chambers caused slight amounts of metal contamination within the chamber environment, but this contamination was tolerated because it did not adversely effect larger architecture IC fabrication. However, as semiconductor features have diminished in size, for example from 0.5 microns to 0.13 microns, with a corresponding increase in complexity, the processes used to etch the features into the semiconductor devices have become much more sensitive to their environments and, more particularly, to metallic contaminants.

As a result, etch chamber materials, such as their state of cleanliness, temperature, and electrical state, must be more stringently controlled than in the past. Process requirements often require high-purity, metal free ceramics with tightly controlled temperature profiles to form the environment in which wafers are etched. In addition, in many cases the ceramics must be electrically conductive to provide low impedance ground paths for the plasma.

Since ceramics are brittle materials, with coefficients of thermal expansion much different than metal components of the chamber, the interfacing of the ceramic components to metal components is problematic. Critical interfaces are present in the etch chamber in which ceramic liner parts are attached to metal components which heat them and maintain their temperature within closely controlled limits. Because these interfaces occur between metal and ceramic components, loading must be controlled and not excessive, or damage such as fracturing or breakage may occur to the ceramics. These requirements dictate careful torquing of chamber bolts to achieve pressure in the desired range. Since assembly time is very important to the chip manufacturer, and since errors in the torquing of the bolts result in costly damage to ceramics, it is important to assemble the joints quickly and accurately.

In addition, since heat is transmitted by conduction across the metal and ceramic interface, the pressure over the entire surface of the interface should be maintained above a threshold value for the heat to be transmitted efficiently. However, the thermal expansion of the supporting metal components is far greater than that of the ceramics, creating a situation in which the ceramics are fractured by expansion loads when supported tightly enough to provide a good thermal conductance across the interface.

In view of the forgoing, what is needed are improved methods and apparatuses for interfacing ceramics and metals within a plasma chamber to reduce damage caused to ceramics by the thermal expansion of the supporting metal components. Further, there is a need for methods and apparatuses that allow assembly of plasma reaction chambers quickly and accurately to reduce down time for the reactor and increase reactor yield.

SUMMARY OF THE INVENTION

Broadly speaking, the present invention fills these needs by providing an apparatus for interfacing ceramic and metal reaction chamber components. More particularly, the apparatus is configured to reduce damage caused to ceramics from the thermal expansion of supporting metal components. In one embodiment, a clamp ring is provided which is configured for thermal expansion without a corresponding substantial increase in diameter. The clamp ring includes a unitary plate having a plurality of attachment pad regions. The attachment pad regions are connected together with connecting regions which are relatively more deformable to thermal stresses than are the attachment pad regions. Advantageously, the connecting regions allow the attachment pad regions to expand in response to high temperatures while allowing the clamp ring to maintain essentially the same circumference.

In another embodiment, a bolt tensioning assembly is disclosed. In this embodiment, a receiving body having an end portion provided with a recess and a threaded bore is engaged with a bolt having a head and threaded shaft. In addition, a plurality of spring washers are disposed in the recess and engaged with the shaft between the head and the end portion of the receiving body. The bolt tensioning assembly of the present invention allows the plasma chamber to be assembled quickly and accurately visually, without the need of a torque wrench.

In yet another embodiment, the invention relates to a plasma reaction chamber having a ceramic chamber with a heater flange. A heater assembly is located above the upper surface of the heater flange, and a clamp ring is located below the lower surface of the heater flange. The clamp ring includes a unitary plate having a plurality of attachment pad regions. Connecting the attachment pad regions together are connecting regions that are relatively more deformable to thermal stresses than are the attachment pad regions. Finally, a plurality of fasteners are provided which fasten the clamp ring to the heater assembly. The plasma reaction chamber of the present invention has an advantage of rapid assembly and disassembly for ease of cleaning and other maintenance which in turn reduces down time for the reactor.

A further embodiment of the present invention discloses a method for assembling a plasma reaction chamber having a ceramic chamber with a heater flange. The method includes placing a heater assembly with a threaded bore above the upper surface of the heater flange. A clamp ring is then positioned below the lower surface of the heater flange. The clamp ring includes a unitary plate having a plurality of attachment pad regions each provided with a recess, and a plurality of connecting regions connecting the attachment pad regions together. A bolt is then engaged with the threaded bore of the heater assembly. The bolt includes an indicator washer and a plurality of spring washers. Once engaged, the bolt is turned by hand until the spring washers come into confinement within the recess. Finally, the bolt is turned fractionally further until a gap between the indicator washer and the clamp ring is closed, thus setting the clamp ring load to a value that was designed into the clamp ring.

Advantageously, the plasma reaction chamber of the present invention can be assembled and disassembled quickly and accurately without the need of a torque wrench. The rapid assembly and disassembly reduces down time for the reactor, thus increasing reactor yield and profit. In addition, the clamp ring of the present invention reduces damage to the ceramics of the chamber by allowing, thermal expansion of the individual attachment pad regions without substantially changing the circumference of the clamp ring. These and other advantages of the present invention will become apparent to those skilled in the art upon reading the following detailed description of the invention and studying the accompanying drawings.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 7A is a cross-sectional view of an unengaged bolt tensioning assembly in accordance with one embodiment of the present invention;

FIG. 7B is a cross-sectional view of a partially engaged bolt tensioning assembly in accordance with another embodiment of the present invention; and FIG. 7C is a cross-sectional view of a fully engaged bolt tensioning assembly in accordance with yet another embodiment of the present invention.

DETAILED DESCRIPTION OF THE PREFERRED EMBODIMENTS

An invention is described for reducing damage to ceramics in a plasma reaction chamber caused by thermal expansion of metal supporting components. In the following description, numerous specific details are set forth in order to provide a thorough understanding of the present invention. It will be apparent, however, to one skilled in the art, that the present invention may be practiced without some or all of these specific details. In other instances, well known process operations have not been described in detail in order not to unnecessarily obscure the present invention.

Figure 1:
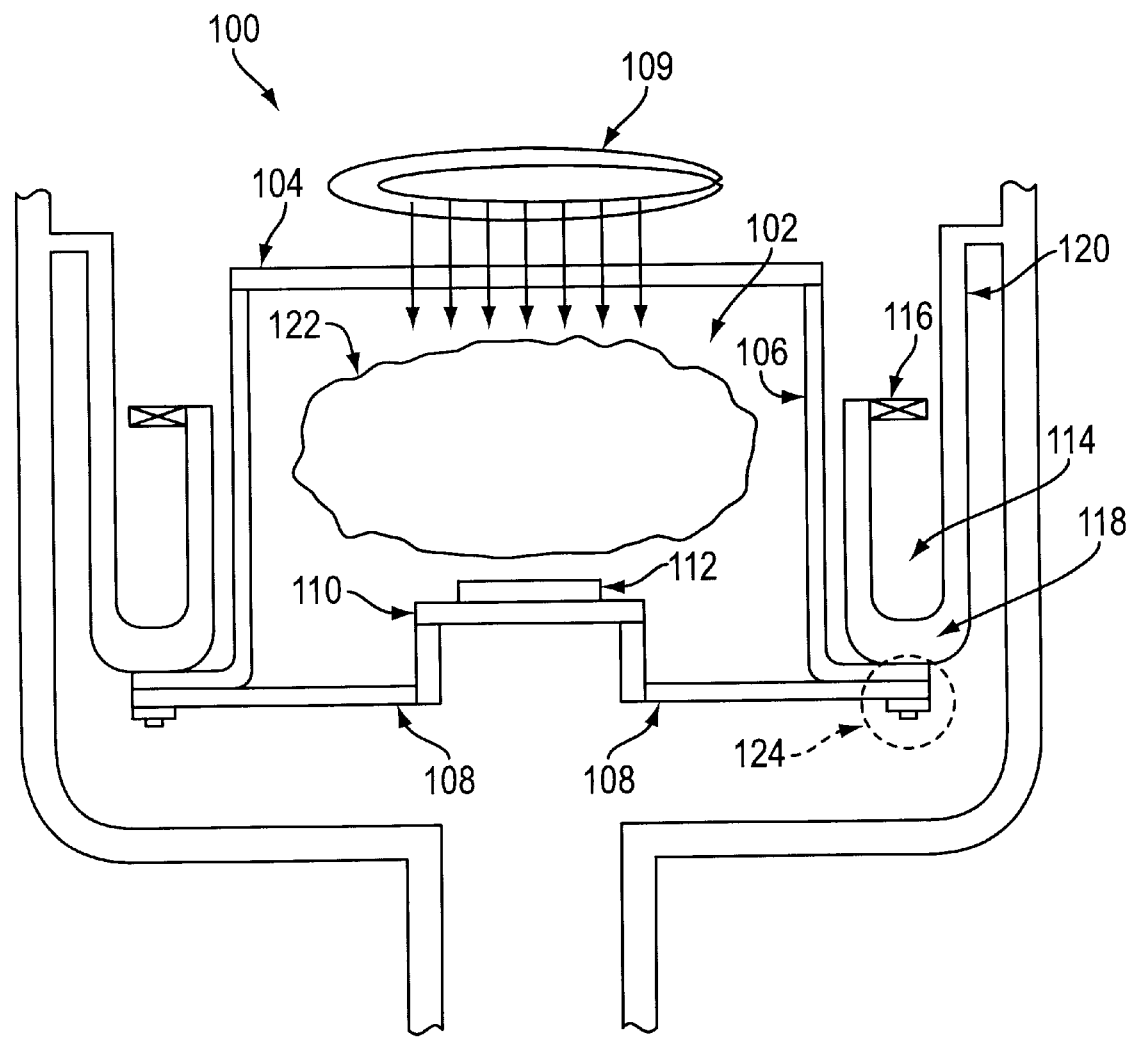
FIG. 1 is a simplified schematic diagram of a plasma reactor system in accordance with one embodiment of the present invention.

FIG. 1 is a simplified schematic of a plasma reactor 100 in accordance with one aspect of the present invention. The plasma reactor 100 includes an a silicon carbide (SiC) lined chamber 102 having an SiC ceiling 104, an SiC cylinder wall 106, and an SiC perforated plate 108. Above chamber 102, there is disposed an induction coil 109, which inductively couples RF energy to the chamber 102. Within the chamber 102 there is provided an electrostatic chuck and electrode 110, and a wafer 112 positioned above the electrode 110. Also included in the plasma reactor 100 is a heater assembly 114 including a heating element 116, a compliant aluminum support 118, and a flexible heat bleed 120. The heater assembly 114 interfaces with the SiC lined chamber 102 via ceramic/metal component interface assembly 124.

During operation, gas is released into the chamber 102. The induction coil 109 is then utilized, in conjunction with the gas, the electrode 110, and an RF generator (not shown), to form a plasma 122 within the chamber 102 as is well know to those skilled in the art. At the bottom of the chamber 102, the SiC perforated plate 108 provides an electrical floor. By transferring a charge to the SiC perforated plate 108, the plasma 122 is contained within the chamber 102, while simultaneously allowing gases to freely pass through the charged perforated plate 108.

The temperature of the SiC cylinder wall 106 is controlled the heater assembly 114. Initially, heat is provided by the heater assembly 114. Then, when the plasma 122 is formed, the plasma 122 begins to add heat to the SiC cylinder wall 106. When this happens, the heater assembly 114 begins to pull back and allows the heat to be supplied by the plasma 122. When the plasma 122 is turned off, the chamber 102 starts cooling again. The heater assembly 114 then takes over and begins heating again. Thus, the cylinder wall 106, and perforated plate 108 continue to have essentially the same heat throughout the process, either supplied by the plasma 122, the heater assembly 114, or in part by both. Therefore, by switching between the heating assembly 114 and the plasma 122, the temperature can be controlled within the chamber 102.

Figure 2:
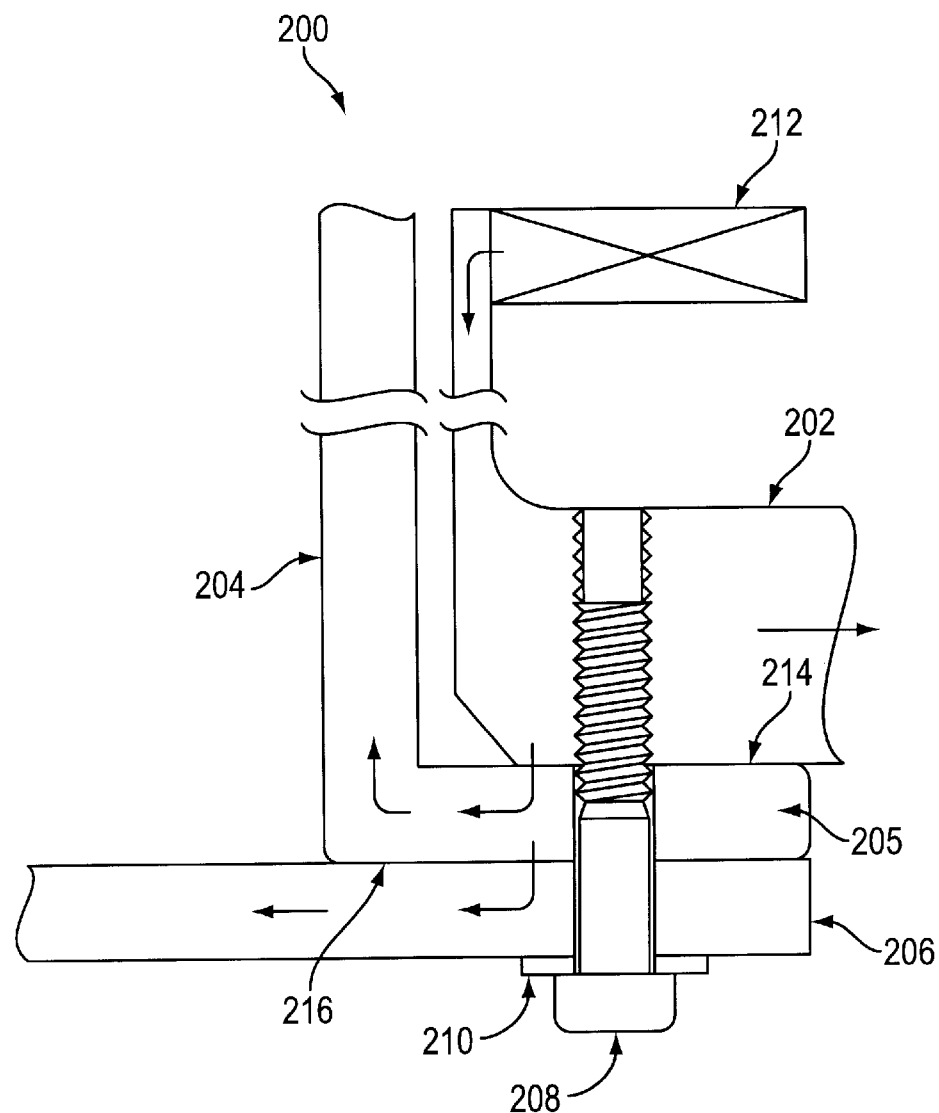
FIG. 2 is a cross-sectional view of a ceramic/metal component interface assembly in accordance with another embodiment of the present invention.

Heat provided by the heater assembly 114, is transferred to the SiC cylinder wall 106 by conduction utilizing the ceramic/metal component interface assembly 124. FIG. 2 shows cross-sectional view of a ceramic/metal component interface assembly 200 in accordance with one embodiment of the present invention. The interface assembly 200 includes a heater assembly 202, a ceramic cylinder wall 204 with a heater flange 205 positioned below the heater assembly 202, a ceramic perforated plate 206 disposed below the heater flange 205, and a bolt tensioning assembly 208 having a washer 210 engaged with the heater assembly 202.

When heating the reactor chamber, heat provided by a heating element 212 conducts through the heating assembly 202 across a first heating interface 214 to the heater flange 205, and then to the cylinder wall 204. In addition, heat from the heating element 212 flows from the heating flange 205, across a second heating interface 216 to the perforated plate 206.

For proper temperature control, loads across the first heating interface 214 and the second heating interface 216 must be carefully controlled. If the loads are too high, the ceramic will crack, and if the loads are too low then there are heat conductance problems. Therefore, the proper load is preferably uniformly distributed along the heater flange 205. To achieve a near uniform load along the heater flange 205, a plurality of bolt tensioning assemblies are distributed about the heater flange. Washers 210 are used to increase the uniformity of the load generated by the bolt head of the bolt tensioning assembly 208.

The ceramic/metal component interface assembly 200 has the benefits of allowing good heat conduction across the first and second heating interfaces 214 and 216, however the ceramic components may suffer damage over long time use. First, the load generated from the bolt tensioning assembly 208 is distributed in a fairly limited area, generally, the area covered by the washer 210. This causes damage to the ceramic surrounding the washer 210 because of the uneven load distribution. Second, because of the poor tensile capability and the lack of ductility of silicon carbide, the two hard brittle surfaces of the ceramic heater flange 205 and the perforated plate 206 in contact with each other are unforgiving when faced with particles or chips between them and often fracture when a load is applied.

Therefore, a preferred embodiment of the present invention uses a clamp ring positioned below the perforated plate 206 to increase load uniformity, and a spacer ring disposed between the heater flange 205 and the perforated plate 206 to provide elasticity to the ceramic interface between the heater flange 205 and the perforated plate 206 which reduces ceramic fracture. In a further preferred embodiment, a metal heater flange may is attached to the SiC cylinder sidewall 204 replacing the SiC heater flange 205. The metal heater flange eliminates the need for a spacer ring because there are no longer two ceramic surfaces in contact with each other in this configuration.

Figure 3A:
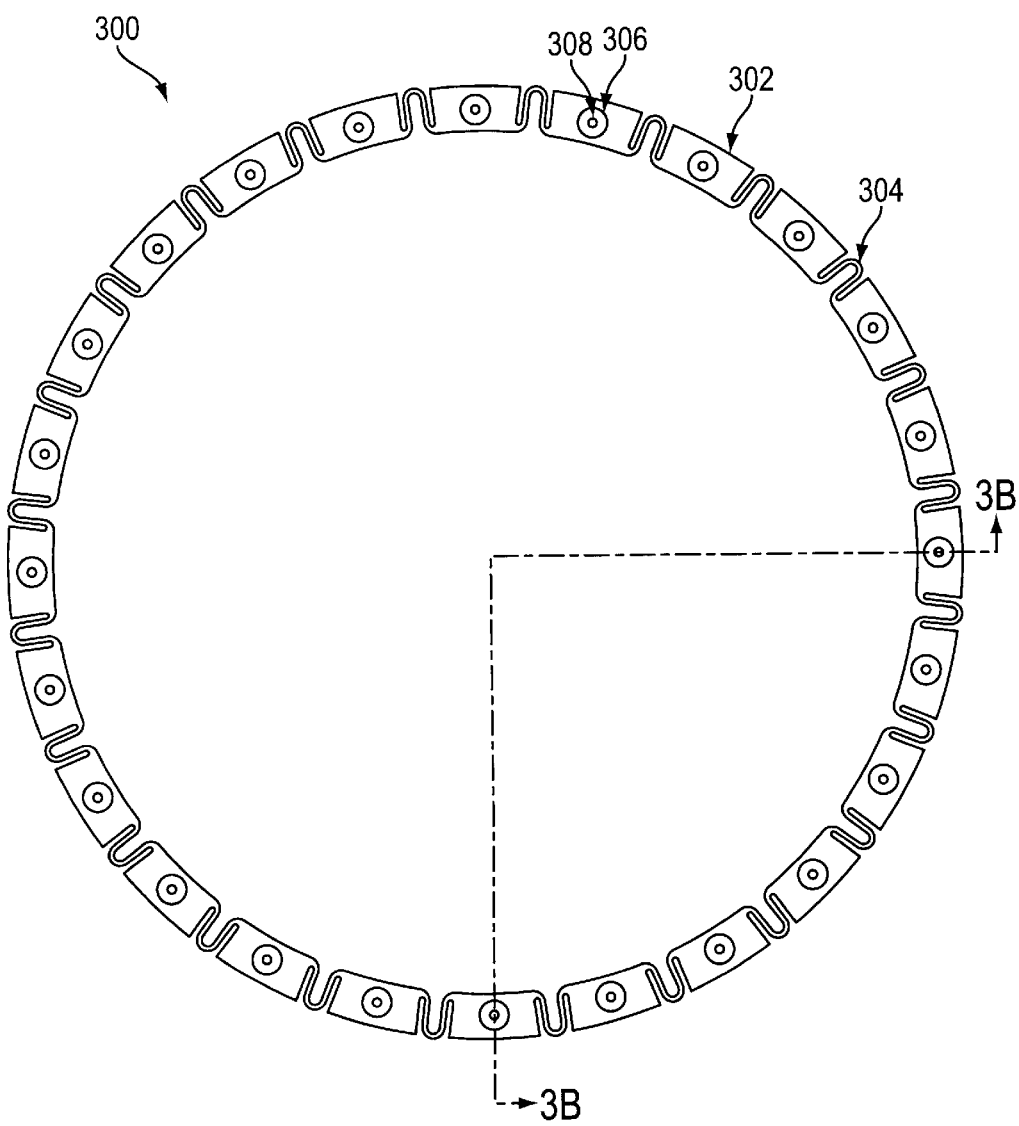
FIG. 3A is a top view of a clamp ring in accordance with yet another embodiment of the present invention.
Figure 3B:
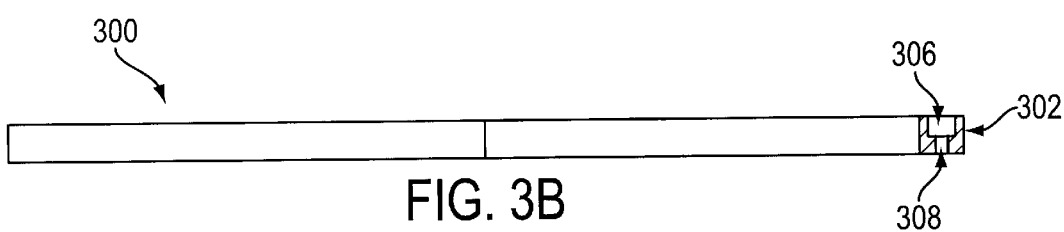
FIG. 3B is a side view of the clamp ring in accordance with one embodiment of the present invention.

FIG. 3A is a top view of a clamp ring 300 in accordance with a preferred embodiment of the present invention. The clamp ring 300 includes a unitary plate provided with a plurality of attachment pad regions 302, and a plurality of connecting regions 304 connecting the attachment pad regions 302. Each attachment pad region 302 includes a recess 306 and a bolt aperture 308. A preferred embodiment includes 24 attachment pad regions 302. FIG. 3B is a side view of the clamp ring 300, further illustrating an attachment pad region 302 having a recess 306 and a bolt aperture 308.

In use, the clamp ring 300, preferably containing aluminum or some other metal with a similar elasticity, is positioned below the lower surface of the heater flange. More specifically, the clamp ring 300 is positioned below the perforated plate, and attached through the apertures 308 in the attachment pad regions 302 utilizing bolt tensioning assemblies. The attachment pad regions 302 distribute the local force under the bolt tensioning assemblies to a fairly uniform applied load over the contact area of the clamp ring 300. This reduces damage caused to the ceramics by uneven load distribution when using individual bolts without substantial load distribution.

However, as the aluminum is heated, it thermally expands about ten times as much as silicon carbide. Therefore, a solid aluminum clamp ring would expand about a tenth of an inch in diameter, while the chamber ceramics would only expand about one hundredth of an inch. This difference in thermal diameter growth of a solid aluminum clamp ring and the ceramic chamber would create a tremendous load which would crack the ceramic. The present invention addresses this issue by connecting the attachment pad regions 302 with connecting regions 304. The individual attachment pad regions 302 are large and solid enough to distribute the load effectively, but, since they are aluminum they will thermally expand ten times as much as the ceramics. However, the connection regions 304 are relatively more deformable than the attachment pad regions in response to thermal stresses, and act as expansion members to absorb the loads from thermal expansion of connected attachment pad regions 302 without pushing off the other connected attachment pad region. Thus, the clamp ring 300 of the present invention essentially only grows in increments and does not increase substantially in radius, resulting in a substantial reduction of the load caused by thermal expansion of the clamp ring 300.

Figure 4A:
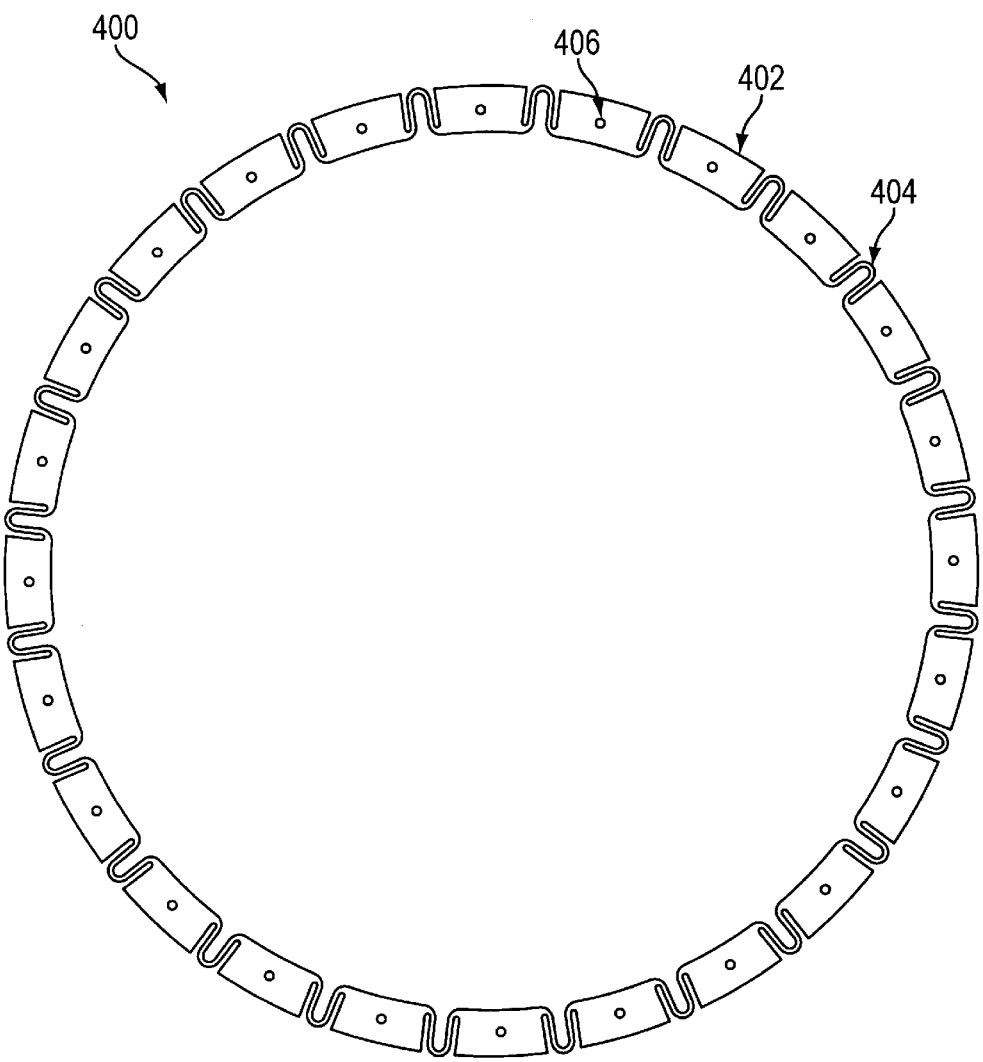
FIG. 4A is a top view of a spacer ring in accordance with one aspect of the present invention.
Figure 4B:
FIG. 4B is a side view of the spacer ring in accordance with one aspect of the present invention.

A similar technique is used to reduce ceramic fracture between the heater flange and the perforated plate. FIG. 4A is a top view of a spacer ring 400 in accordance with a preferred embodiment of the present invention. The spacer ring 400 includes a unitary plate provided with a plurality of spacer pad regions 402, and a plurality of connecting regions 404 connecting the spacer pad regions 402. Each spacer pad region 402 includes a bolt aperture 406. FIG. 4B is a side view of the spacer ring 400.

The spacer ring 400, preferably containing aluminum or some other metal with a similar elasticity which generally does not damage the ceramics, is disposed between the lower surface of the heater flange and the upper surface of the perforated plate, and attached through the apertures 406 with bolt tensioning assemblies. The soft aluminum spacer regions 402 provide the necessary elasticity to the interface between the ceramic heater flange and perforated plate to reduce the probability of ceramic fracture.

However, the aluminum spacer ring 400 also has a markedly different thermal expansion rate than the surrounding ceramics, thus it too must be made compliant with deformable connecting regions 404. The difference in thermal diameter growth of a solid aluminum spacer ring and the ceramic chamber would create a tremendous load which would crack the ceramic. The present invention address this issue by connecting spacer pad regions 402 with connecting regions 404. The individual spacer pad regions 402 are large and solid enough to provide the necessary elasticity to the interface of the ceramic components, but since they are aluminum, will thermally expand ten times as much as the surrounding ceramics. The connection regions 404 are relatively more deformable than the spacer pad regions 402 in response to thermal stresses. Each connection region 404 acts as a spring to absorb the load from the thermal expansion of a connected spacer pad region 402 without pushing off the other connected spacer pad region. Thus, the spacer ring 400 of the present invention essentially only grows in increments and does not increase substantially in radius, resulting in a substantial reduction of the load caused by the thermal expansion of the spacer ring 400.

Figure 5:
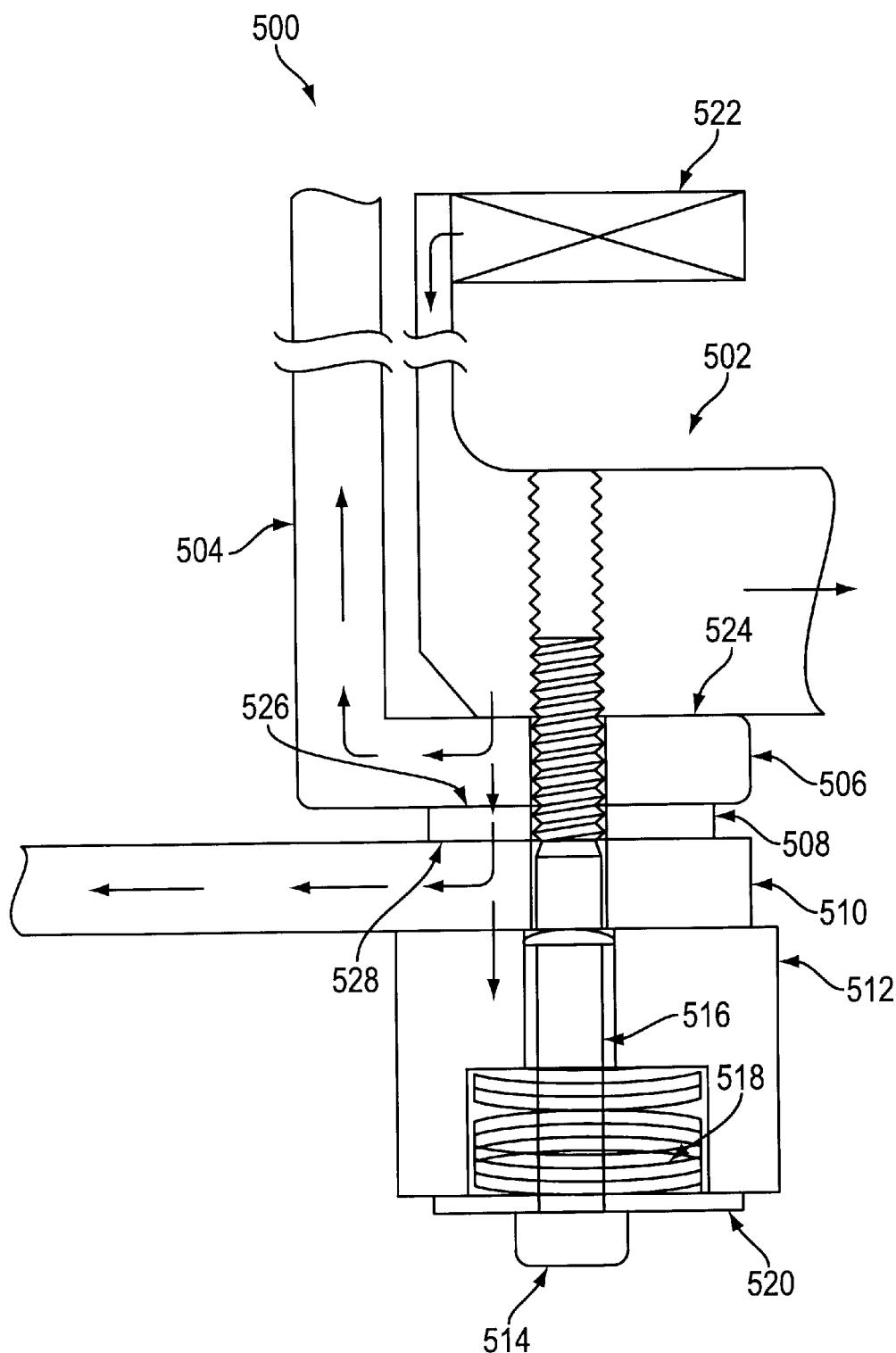
FIG. 5 is a cross-sectional view of a ceramic/metal component interface assembly in accordance with another aspect of the present invention.

To further facilitate discussion, FIG. 5 shows a cross-sectional view of a ceramic/metal component interface assembly 500 in accordance with a preferred embodiment of the present invention. The interface assembly 500 includes a ceramic cylinder wall 504 with a heater flange 506, a heater assembly 502, positioned above the heater flange 506, a clamp ring 512 disposed below the lower surface of the heater flange 506, and a bolt tensioning assembly 514 fastening the clamp ring 512 to the heater assembly 500. Positioned above the clamp ring 512 is a ceramic perforated plate 510, and disposed between the heater flange 506 and the perforated plate 510 is a spacer ring 508. The bolt tensioning assembly 514 includes a bolt 516, spring washers 518, and an indicator washer 520. Note, the spacer ring 508 is generally only necessary if two ceramic components are present in the ceramic/metal component interface assembly 500. The spacer ring 508 will then avoid the precarious situation where two brittle surfaces are in contact under the load.

When heating the reactor chamber, heat provided by a heating element 522 conducts heat through the heating assembly 502 across a first heating interface 524 to the heater flange 506, and then to the ceramic cylinder wall 504. In addition, heat flows from the heating flange 506, across a second heating interface 526 to the spacer ring 508, and then across a third heating interface 528 to the perforated plate 510. Finally, heat flows from the perforated plate 510 to the clamp ring 512.

For proper temperature control, loads across the first heating interface 524, the second heating interface 526, and the third heating interface 528 must be carefully controlled. If the loads are too high, the ceramic will crack, if the loads are too low then there are heat conductance problems. Therefore, the proper load is preferably uniformly distributed along the heater flange 506. The present invention address this issue by using the clamp ring 512. The attachment pad regions of the clamp ring 512 distribute the local force under the bolt tensioning assemblies to a fairly uniform applied load over the contact area of the clamp ring 512. Thus, reducing damage to the ceramics caused by uneven load distribution when using individual bolts without a substantial load distribution system.

As discussed above with reference to FIG. 3, the present invention address the issue of thermal expansion differences in the clamp ring 512 and the ceramics by connecting the attachment pad regions with connecting regions. Each connection region acts as a spring to absorb the load from the thermal expansion of a connected attachment pad region without pushing off the other connected attachment pad region. Thus, the clamp ring 512 of the present invention essentially only grows in increments and does not increase substantially in radius, resulting in a substantial reduction of the load caused by thermal expansion of the clamp ring 512.

A similar technique is used to reduce fracture between the ceramic heater flange 506 and the perforated plate 510. The soft aluminum spacer regions of the spacer ring 508 provide the necessary elasticity to the interface between the ceramic heater flange 506 and perforated plate 510 to reduce the probability of ceramic fracture. Connecting regions are used to connect the spacer regions of the spacer ring 508 to reduce damage from thermal expansion as in the clamp ring 512.

The interface assembly 500 has a further advantage of quickness and ease of assembly and disassembly. Since the spacer ring 508 and the clamp ring 512 are single unitary components, they can each be positioned more quickly than individual attachment pad regions and/or individual spacer regions.

Figure 6:
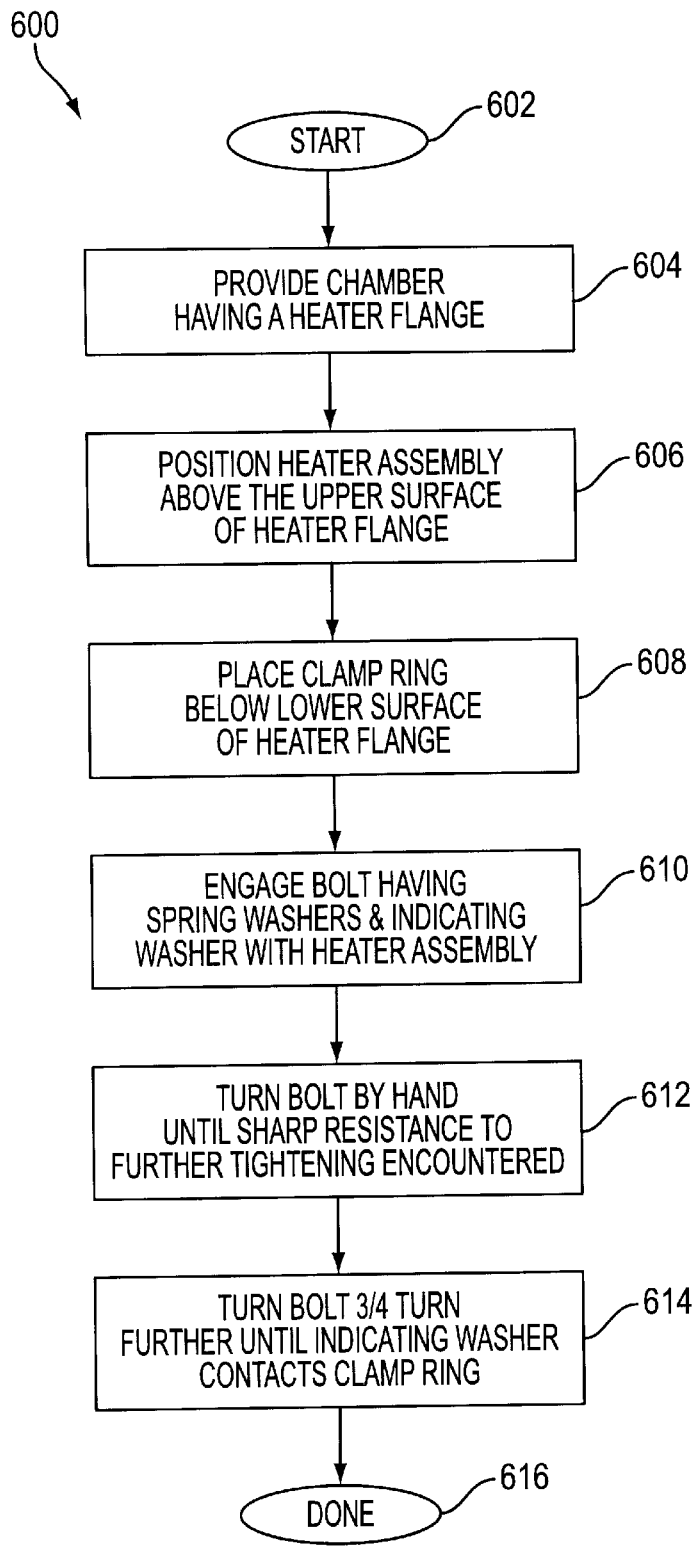
FIG. 6 is a flowchart showing a method for assembling a plasma reaction chamber in accordance with yet another aspect of the present invention.

FIG. 6 is a flowchart showing a method 600 for assembling a plasma reaction chamber in accordance with yet another embodiment of the present invention. The method 600 begins with an initial operation 602, in which preparation steps, well known to those skilled in the art, are taken to begin assembly of the reaction chamber.

In an operation 604, a chamber having a heater flange is provided. Preferably the chamber is composed of silicon carbide to reduce metallization contamination within the chamber environment. In addition, silicon carbide reaction chambers last about ten times as long as aluminum reaction chambers.

Next, in operation 606, a heater assembly is positioned above the upper surface of the heater flange. Preferably the heater assembly includes a threaded bore to receive a bolt tensioning assembly used to attach the components of the ceramic/metal component interface. The heater assembly also preferably includes a heating element to provide heat to the reaction chamber.

In operation 608, a clamp ring is placed below the lower surface of the heater flange. Operation 608 may also include placing a spacer ring in contact with the lower surface of the heater flange, and positioning a perforated plate below the spacer ring. The spacer ring reduces fracture to the ceramics, and the perforated plate provides an electrical floor for the plasma while allowing gases to pass through it. The clamp ring provides essentially uniform load distribution along the contact portion of the clamp ring.

In a bolt engaging operation 610, a bolt tensioning assembly is engaged with the threaded bore of the heater assembly. The bolt tensioning assembly includes a bolt, an indicator washer below the bolt head, and a plurality of spring washers disposed below the indicator washer. In some embodiments, the bolt tensioning assembly is positioned within the recess of the clamp ring and held in place by the spring washers. This has the advantage of further reducing the number of individual pieces needed during the assembly and disassembly of the plasma reaction chamber.

Next in a hand torque operation 612, the bolt is turned by hand until the spring washers come into confinement within the recess of the clamp ring. This is generally perceived as a sharp transition between the bolt freely turning and encountering resistance to further tightening.

The precise setting of the clamp ring pressure is then set in load setting operation 614. In load setting operation 614, the bolt is typically turned fractionally, e.g., a further ¾ turn, until a gap between the indicator washer and the clamp ring is closed. At this point the clamp load is set at a precise value that was designed into the part, without regard to torque value or to thread lubrication (not allowed in the ultra clean etch environment), which is always an important variable in converting bolt torque to the applied load.

An alternate embodiment configures the clamp ring recess such that after, for example, a ¾ turn of the bolt to apply the correct load, a small gap (about 0.005 to 0.010 inch) is present between the indicator washer and the clamp ring to insure that an excessive load has not been applied. The gaps in the 24 indicator washers can be easily compared visually for uniformity, and a quantitative check of a single gap will verify that the correct gap value has been set. The fine pitch of the screw thread allows a small gap to be set with ample resolution. The spring washers and indicator washer of the bolt tensioning assembly are chosen such that when the operations of method 600 are followed the proper torque value is applied to the ceramic/metal interface assembly.

In a further embodiment, a shoulder bolt is utilized to increase accuracy in applying the correct load. The shoulder bolt is configured such that when the correct load is applied, the bolt shoulder bottoms on the heating assembly. The advantage of this embodiment is that it reduces inaccuracies arising from estimating a ¾ turn. As with the above embodiments, the spring washers and indicator washer of the bolt tensioning assembly are chosen such that when the operations of method 600 are followed the proper torque value is applied to the ceramic/metal interface assembly.

Finally, in operation 616, the plasma reaction chamber undergoes additional post-assembly operations which are conventional in nature. Thereafter, the assembled plasma reaction chamber may be utilized for IC fabrication, and the resulting chips incorporated into electronic devices, e.g., any well known commercial or consumer electronic devices, including digital computers.

To elaborate further, FIG. 7A is cross-sectional view of an unengaged bolt tensioning assembly 700 in accordance with one embodiment of the present invention. The bolt tensioning assembly 700 includes a receiving body comprising a heater assembly 702 having a threaded bore 703, a heater flange 704 positioned below the heater assembly 702, a spacer ring 706 disposed between the heater flange 704 and a perforated plate 708, and a clamp ring 710 having a recess 712 positioned below the perforated plate 708. Further included in the bolt tensioning assembly 700 is a bolt 714, a plurality of spring washers 716 disposed within the recess 712, and an indicator washer 718 positioned between the bolt head and the spring washers 716.

During assembly, the threaded shaft of the bolt 714 is engaged with the threaded bore 703 of the heater assembly 702. The bolt 714 is then turned by hand until the spring washers 716 come into confinement within the recess 712 of the clamp ring 710, as shown in FIG. 7B. This is generally perceived as a sharp transition between the bolt freely turning and encountering resistance to further tightening. Generally, a gap 720 will still be present between the clamp ring 710 and the indicator washer 718 when the spring washers 716 come into confinement within the recess 712.

The bolt 714 is then turned a further, preferably fractional, amount, e.g., a ¾ turn, until the gap 720 between the indicator washer 718 and the clamp ring 710 is closed, as shown in FIG. 7C. At this point the clamp load is set at the precise value that was designed into the part, without regard to torque value or to thread lubrication (not allowed in the ultra clean etch environment), which is always an important variable in converting the bolt torque to the applied load. As discussed with reference to FIG. 6, an alternate embodiment configures the clamp ring recess 712 such that after the required ¾ turn of the bolt to apply the correct load, a small gap (about 0.005 to 0.010 inch) is present between the indicator washer 718 and the clamp ring 710 to insure that excessive load has not been applied. The gaps in the 24 indicator washers can be easily compared visually for uniformity, and a quantitative check of a single gap will verify that the correct gap value has been set. The fine pitch of the screw thread allows the small gap to be set with ample resolution.

The invention has been described herein in terms of several preferred embodiments, there are many alterations, permutations and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A clamp ring configured for thermal expansion, comprising:
    a unitary plate provided with a plurality of attachment pad regions; and
    a plurality of connecting regions connecting said plurality of attachment pad regions, said connecting regions being relatively more deformable than said attachment pad regions in response to thermal stresses.

2. A clamp ring as recited in claim 1, wherein the unitary plate includes aluminum.

3. A clamp ring as recited in claim 1, wherein each attachment pad region includes a recess.

4. A clamp ring as recited in claim 3, wherein each attachment pad region further includes a bolt aperture.

5. A clamp ring as recited in claim 1, wherein each connecting region connects a first attachment pad region to a second attachment pad region.

6. A clamp ring as recited in claim 5, wherein each connecting region is capable of absorbing a load from thermal expansion of the first connected attachment pad region without displacing the second connected attachment pad region.

7. A clamp ring as recited in claim 1, comprising 24 attachment pad regions.

8. A bolt tensioning assembly, comprising:
    a receiving body having a clamp ring provided with a recess and a heater assembly provided with a threaded bore:
    a bolt having a head and at least a partially threaded shaft engaged with said threaded bore of said heater assembly; and
    a plurality of spring washers disposed in said recess of said clamp ring and engaged with said shaft.

9. A bolt tensioning assembly as recited in claim 8, further comprising an indicator washer disposed between said head and said plurality of spring washers.

10. A bolt tensioning assembly as recited in claim 9, wherein said spring washers produce an applied load such that a predetermined torque value is achieved by turning said bolt until a gap between said indicator washer and said clamp ring is closed.

11. A bolt tensioning assembly as recited in claim 10, wherein said predetermined torque value is achieved by turning said bolt until said spring washers come into confinement within said recess of said clamp ring, and said bolt is turned a further ¾ turn.

12. A bolt tensioning assembly as recited in claim 8, wherein said clamp ring,
    a unitary plate provided with a plurality of attachment pad regions; and
    a plurality of connecting regions connecting said plurality of attachment pad regions.

13. A plasma reaction chamber, comprising:
    a chamber including a heater flange having an upper surface and a lower surface;
    a heater assembly positioned above said upper surface of said heater flange;
    a clamp ring disposed below said lower surface of said heater flange, said clamp ring including:
        a unitary plate provided with a plurality of attachment pad regions; and
        a plurality of connecting regions connecting said plurality of attachment pad regions, said connecting regions being relatively more deformable than said attachment pad regions in response to thermal stresses; and
    a plurality of fasteners fastening said clamp ring to said heater assembly.

14. A plasma reaction chamber as recited in claim 13, wherein said chamber is a ceramic chamber.

15. A plasma reaction chamber as recited in claim 13, wherein said heater flange is a ceramic heater flange.

16. A plasma reaction chamber as recited in claim 15, further comprising a ceramic perforated plate positioned between said heater flange and said clamp ring.

17. A plasma reaction chamber as recited in claim 16, further comprising a spacer ring disposed between said heater flange and said perforated plate.

18. A plasma reaction chamber as recited in claim 17, wherein said spacer ring comprises:
    a unitary plate provided with a plurality of spacer pad regions; and
    a plurality of connecting regions connecting said plurality of spacer pad regions, said connecting regions being relatively more deformable than said spacer pad regions in response to thermal stresses.

19. A plasma reaction chamber as recited in claim 13, wherein said heater flange is a metal heater flange.

20. A plasma reaction chamber as recited in claim 13, wherein said heater assembly is contacting said upper surface of said heater flange.

21. A plasma reaction chamber as recited in claim 13, wherein each fastener of said plurality of fasteners is a bolt tensioning assembly.

22. A plasma reaction chamber as recited in claim 21, wherein each bolt tensioning assembly comprises:
    a bolt having a head and a threaded shaft;
    a plurality of spring washers engaged with said bolt and positioned between said head and said threaded shaft; and
    an indicator washer disposed between said head and said plurality of spring washers.

23. A method for assembling a plasma reaction chamber, comprising the operations of:

providing a chamber including a heater flange having an upper surface and a lower surface;

positioning a heater assembly above said upper surface of said heater flange, said eater assembly having at least one threaded bore;

placing a clamp ring below said lower surface of said heater flange, said clamp ring including:
  a unitary plate provided with a plurality of attachment pad regions, each attachment pad region having a recess; and
  a plurality of connecting regions connecting said plurality of attachment pad regions, said connecting regions being relatively more deformable than said attachment pad regions in response to thermal stresses;

engaging at least one bolt with said thread bore, said bolt having:
  a head;
  an end portion;
  an indicator washer between said head and said end portion; and
  a plurality of spring washers between said indicator washer and said end potion; and turning said at least one bolt by hand until said spring washers come into confinement within said recess, whereby a clamp ring load is set to a value that was designed into said clamp ring.

24. A method as recited in claim 23, further comprising the operation of turing said bolt ¾ turn further until a gap between said indicator washer and said clamp ring is closed.

25. A method as recited in claim 23, further comprising the operation of turning said bolt ¾ turn further until a predefined gap between said indicator washer and said clamp ring is present.

26. A method as recited in claim 23, wherein said bolt further comprises a bolt shoulder configured such that when a correct load is applied, said bolt shoulder bottoms on said heating assembly.

27. A method as recited in claim 26, further comprising the operation of turning said bolt until said bolt shoulder bottoms on said heating assembly.

28. A method as recited in claim 23, wherein the chamber is a ceramic chamber.

29. A method as recited in claim 23, wherein said heater assembly is contacting said upper surface of said heater flange.

* * * * *